United States Patent
Guo et al.

(10) Patent No.: US 12,354,681 B2
(45) Date of Patent: Jul. 8, 2025

(54) CHANNEL PRE-CHARGE PROCESS IN A MEMORY DEVICE

(71) Applicant: SanDisk Technologies LLC, Addison, TX (US)

(72) Inventors: Jiacen Guo, Cupertino, CA (US); Peng Zhang, San Jose, CA (US); Xiang Yang, Santa Clara, CA (US); Yanli Zhang, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 185 days.

(21) Appl. No.: 18/221,649

(22) Filed: Jul. 13, 2023

(65) Prior Publication Data

US 2024/0203511 A1 Jun. 20, 2024

Related U.S. Application Data

(60) Provisional application No. 63/433,977, filed on Dec. 20, 2022.

(51) Int. Cl.
| | | |
|---|---|---|
| *G11C 11/56* | (2006.01) | |
| *G11C 16/08* | (2006.01) | |
| *G11C 16/10* | (2006.01) | |
| *G11C 16/34* | (2006.01) | |

(52) U.S. Cl.
CPC .......... *G11C 16/3459* (2013.01); *G11C 16/08* (2013.01); *G11C 16/102* (2013.01)

(58) Field of Classification Search
CPC ... G11C 16/3459; G11C 16/08; G11C 16/102; G11C 16/32; G11C 2211/5621; G11C 11/5628; G11C 16/0483; G11C 16/10; G11C 16/24; G11C 16/3418
See application file for complete search history.

(56) References Cited

U.S. PATENT DOCUMENTS

| | | | |
|---|---|---|---|
| 10,068,657 B1 | 9/2018 | Yu et al. | |
| 10,249,372 B2 | 4/2019 | Chen et al. | |
| 10,276,248 B1 | 4/2019 | Lu et al. | |
| 10,482,984 B2 | 11/2019 | Yang et al. | |
| 11,081,179 B2 | 8/2021 | Yang | |

(Continued)

OTHER PUBLICATIONS

U.S. Appl. No. 17/724,769, Two-Side Staircase Pre-Charge in Sub-Block Mode of Three-Tier Non-Volatile Memory Architecture, Jiacen Guo et al., Apr. 20, 2022.

*Primary Examiner* — Hien N Nguyen
(74) *Attorney, Agent, or Firm* — Dickinson Wright PLLC

(57) ABSTRACT

The memory device includes a memory block with memory cells arranged in word lines that are divided into sub-blocks. Control circuitry is configured to program each of the word lines of a selected sub-blocks in a plurality of program loops. During at least one program loop, the control circuitry applies a programming pulse to a selected word line. The control circuitry is also configured to simultaneously apply a verify voltage to the selected word line and a pass voltage to unselected word lines. In a first phase of a multi-phase pre-charge process, the control circuitry reduces the voltages applied to the selected word line and at least one unprogrammed word line to a low voltage. In a second phase that follows the first phase, the control circuitry reduces the voltages applied to all word lines that remained at the pass voltage to the low voltage.

20 Claims, 18 Drawing Sheets

(56) References Cited

U.S. PATENT DOCUMENTS

| | | |
|---|---|---|
| 11,232,841 B2 | 1/2022 | Park et al. |
| 2016/0005479 A1* | 1/2016 | Lee .................... G11C 11/5642 |
| | | 365/185.12 |
| 2016/0267999 A1* | 9/2016 | Takeyama .......... G11C 16/0483 |
| 2019/0392909 A1* | 12/2019 | Yang ...................... G11C 16/32 |
| 2022/0108749 A1* | 4/2022 | Joe .................... G11C 16/0483 |
| 2022/0310182 A1* | 9/2022 | Dong ................ G11C 16/0433 |
| 2023/0343400 A1* | 10/2023 | Guo .................. G11C 16/3459 |
| 2024/0079068 A1* | 3/2024 | Zhao .................. G11C 11/5628 |

\* cited by examiner

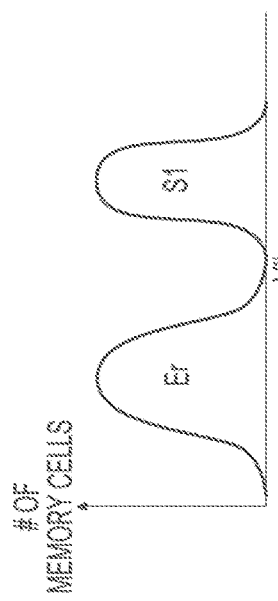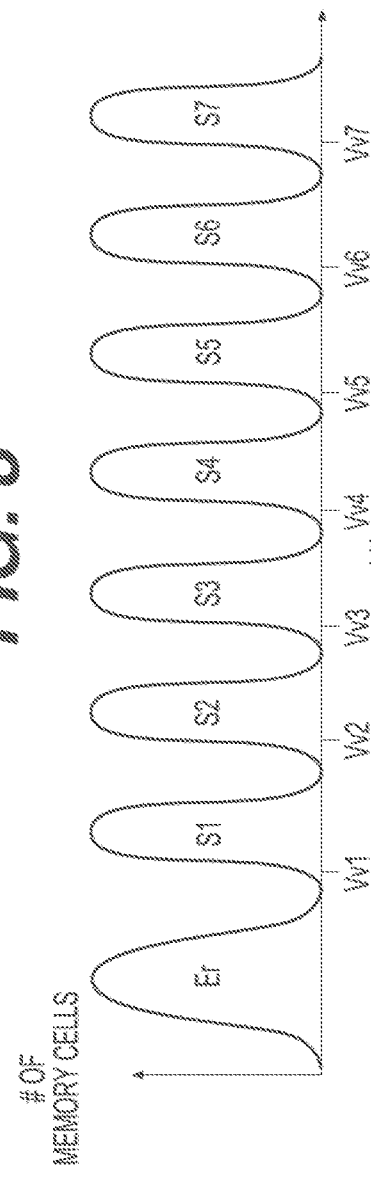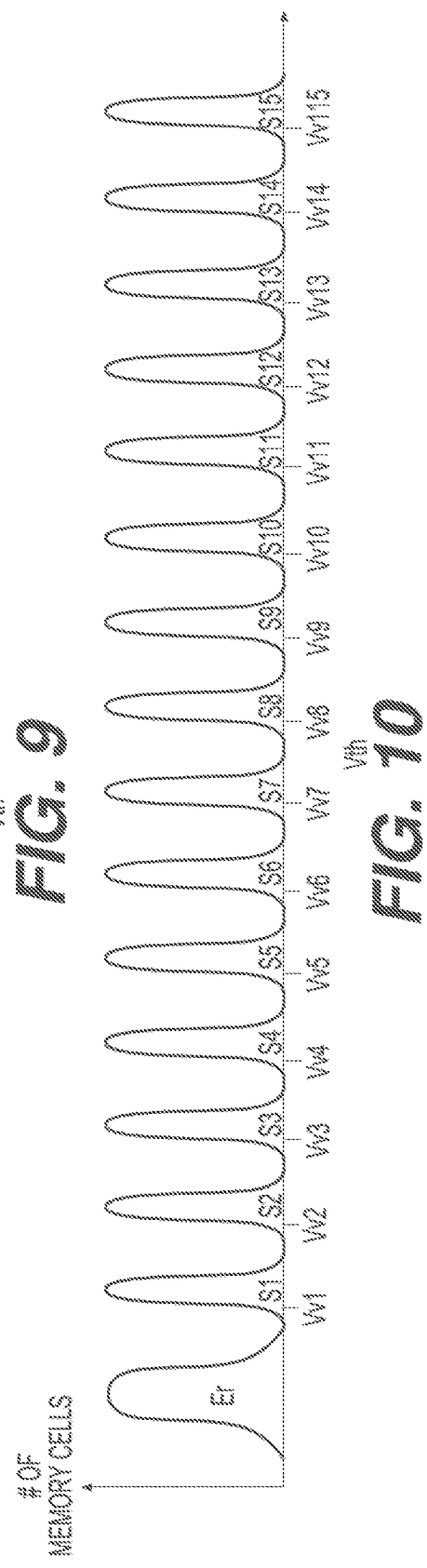

CHANNEL PRE-CHARGE PROCESS IN A MEMORY DEVICE

CROSS-REFERENCE TO RELATED APPLICATIONS

This application claims the benefit of U.S. Provisional Application No. 63/433,977, filed on Dec. 20, 2022. The entire disclosure of the application referenced above is incorporated herein by reference.

BACKGROUND

1. Field

The present disclosure is related generally to the operation of non-volatile memory and more particularly to improved programming techniques to reduce program disturb and resource utilization.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed. Each program loop may also include a pre-charge operation prior to the programming pulse to pre-charge a plurality of channels containing memory cells to be programmed.

SUMMARY

One aspect of the present disclosure is related to a method of programming a memory device. The method includes the step of preparing a memory block that includes a plurality of memory cells arranged in a plurality of word lines that are divided into a plurality of sub-blocks which can be erased and programmed independently of one another. The method continues with the step of programming each of the word lines of a selected sub-block of the plurality of sub-blocks in a plurality of program loops. At least one program loop of the plurality of program loops includes the steps of applying a programming pulse to a selected word line and simultaneously applying a verify voltage to the selected word line and applying a pass voltage to a plurality of unselected word lines. In a first phase of a multi-phase pre-charge process, the voltages applied to at least some of the word lines in the selected memory block are reduced to pre-charge portions of a plurality of channels in the memory block. In a second phase that follows the first phase, the voltages applied to other word lines in the selected memory block are reduced.

According to another aspect of the present disclosure, in the first phase of the multi-phase pre-charge process, the voltages applied to the selected word line and at least one unprogrammed word line in the selected sub-block to a low voltage are reduced, and in the second phase the voltages applied to all word lines that remained at the pass voltage are reduced to the low voltage.

According to yet another aspect of the present disclosure, the programming of the word lines of the selected sub-block is according to a reverse order programming scheme.

According to still another aspect of the present disclosure, the memory block includes three or more sub-blocks including a lower sub-block on a source side of the memory block and an upper sub-block on a drain side of the memory block and at least one middle sub-block that is located between the lower and upper sub-blocks.

According to a further aspect of the present disclosure, the lower sub-block is closed.

According to yet a further aspect of the present disclosure, the upper sub-block is closed, and the selected sub-block is the at least one middle sub-block.

According to still a further aspect of the present disclosure, the memory block includes exactly two sub-blocks including a lower sub-block on a source side of the memory block and an upper sub-block on a drain side of the memory block, the lower sub-block is closed, and the selected sub-block is the upper sub-block.

According to another aspect of the present disclosure, at least one of the program loops includes the step of comparing a number of unprogrammed word lines in the selected sub-block to a threshold, and if the number of unprogrammed word lines in the selected sub-block is less than the threshold, then the multi-phase pre-charge process is skipped and an alternative pre-charge process pre-charges a plurality of channels in the memory block.

Another aspect of the present disclosure is related to a memory device. The memory device includes a memory block with a plurality of memory cells arranged in a plurality of word lines that are divided into a plurality of sub-blocks which can be erased and programmed independently of one another. The memory device also includes control circuitry that is configured to program each of the word lines of a selected sub-blocks of the plurality of sub-blocks in a plurality of program loops. During at least one program loop of the plurality of program loops, the control circuitry is configured to apply a programming pulse to a selected word line. The control circuitry is also configured to simultaneously apply a verify voltage to the selected word line and apply a pass voltage to a plurality of unselected word lines. In a first phase of a multi-phase pre-charge process, the control circuitry reduces the voltages applied to the selected word line and at least one unprogrammed word line in the selected sub-block to a low voltage. In a second phase that follows the first phase of the multi-phase pre-charge process, reduce the voltages applied to all word lines that remained at the pass voltage to the low voltage.

According to another aspect of the present disclosure, the control circuitry is configured to program the word lines of the selected sub-block according to a reverse order programming scheme.

According to yet another aspect of the present disclosure, the memory block includes three or more sub-blocks including a lower sub-block on a source side of the memory block and an upper sub-block on a drain side of the memory block and at least one middle sub-block that is located between the lower and upper sub-blocks.

According to still another aspect of the present disclosure, the lower sub-block is closed.

According to a further aspect of the present disclosure, the upper sub-block is closed, and the selected sub-block is the at least one middle sub-block.

According to yet a further aspect of the present disclosure, the memory block includes exactly two sub-blocks. One of the sub-blocks is a lower sub-block on a source side of the memory block, and the other sub-block is an upper sub-block on a drain side of the memory block. The lower sub-block is closed, and the selected sub-block is the upper sub-block.

According to still a further aspect of the present disclosure, in at least one of the program loops, the control circuitry is configured to compare a number of unprogrammed word lines in the selected sub-block to a threshold. If the number of unprogrammed word lines in the selected sub-block is less than the threshold, then the control circuitry is configured to skip the multi-phase pre-charge process and apply an alternative pre-charge process to pre-charge a plurality of channels in the memory block.

Yet another aspect of the present disclosure is related to an apparatus. The apparatus includes a memory block that includes a plurality of memory cells arranged in a plurality of word lines that are divided into at least three sub-blocks which can be erased and programmed independently of one another. The at least three sub-blocks include an upper sub-block on one side of the memory block, a lower sub-block on an opposite side of the memory block, and a middle sub-block between the upper and lower sub-blocks. The apparatus also includes a programming means for programming the memory cells of each of the word lines of a selected sub-blocks of the plurality of sub-blocks in a plurality of program loops. The selected sub-block is the middle sub-block according to a reverse order programming scheme. During at least one program loop, the programming means is configured to simultaneously apply a verify voltage to a selected word line in the middle sub-block and apply a pass voltage to a plurality of unselected word lines. In a first phase of a multi-phase pre-charge process, the programming means is configured to reduce the voltages applied to the selected word line and at least one unprogrammed word line in the middle sub-block to a low voltage. In a second phase that follows the first phase, the programming means is configured to reduce the voltages applied to all word lines that remained at the pass voltage to the low voltage.

According to another aspect of the present disclosure, the programming means is configured to program the word lines of all of the sub-blocks according to the reverse order programming scheme.

According to yet another aspect of the present disclosure, the lower sub-block is closed.

According to still another aspect of the present disclosure, the upper sub-block is closed.

According to a further aspect of the present disclosure, in at least one of the program loops, the programming means is configured to compare a number of unprogrammed word lines in the middle sub-block to a threshold. If the number of unprogrammed word lines in the selected sub-block is less than the threshold, then the programming means is configured to skip the multi-phase pre-charge process and apply an alternative pre-charge process to pre-charge a plurality of channels in the memory block.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 8 depicts a threshold voltage distribution of a page of memory cells programmed to one bit per memory cell (SLC):

FIG. 9 depicts a threshold voltage distribution of a page of memory cells programmed to three bits per memory cell (TLC):

FIG. 10 depicts a threshold voltage distribution of a page of memory cells programmed to four bits per memory cell (QLC):

DESCRIPTION OF THE ENABLING EMBODIMENTS

The present disclosure is related to programming techniques for programming memory cells in a NAND solid-state memory device that includes a memory block with a plurality of sub-blocks that each include a plurality of word lines. More specifically, these programming techniques more efficiently pre-charge a plurality of channels in the memory device prior to the application of a programming pulse such that program disturb, or the unintentional programming of memory cells that are intended to be inhibited from programming, is minimized. This result is achieved by, executing a two-phase voltage ramp-down operation at the end of a verify operation of one program loop prior to the application of a programming pulse in the following program loop. In a first phase of the ramp-down operation, the voltages applied to a selected word line containing the memory cells being programmed and a plurality of unprogrammed word lines within a selected sub-block are reduced while the voltages of the remaining word lines in the memory block remain at elevated levels. By doing this, electrons in a plurality of channels within the memory block vacate the areas of the selected word line, thereby pre-charging these areas of the channels. In a second phase of the ramp-down operation, the voltages applied to the remaining word lines are reduced. The following programming pulse can then be applied to the selected word line and, because the areas of the channels adjacent the selected word line have been pre-charged, the effects of program disturb are minimized. As also discussed in further detail below, these programming techniques add minimal time to the verify operation and require far less time than some other known types of pre-charge operations.

Figure 1A:
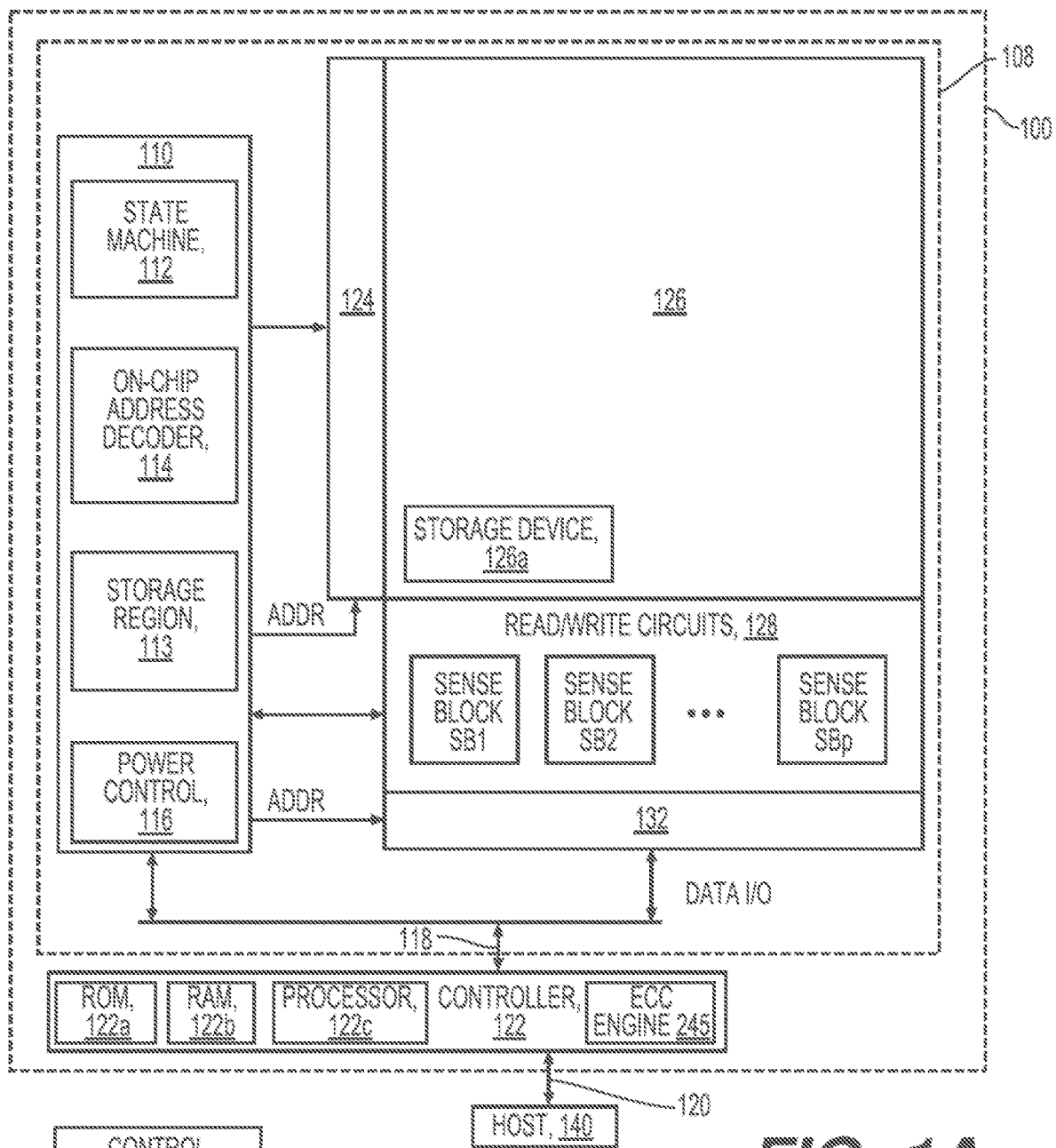
FIG. 1A is a block diagram of an example memory device.

FIG. 1A is a block diagram of an example memory device 100 is configured to operate according to the programming techniques of the present disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, ... SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, ..., SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

Figure 1B:
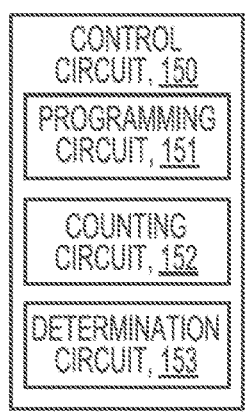
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245.

The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
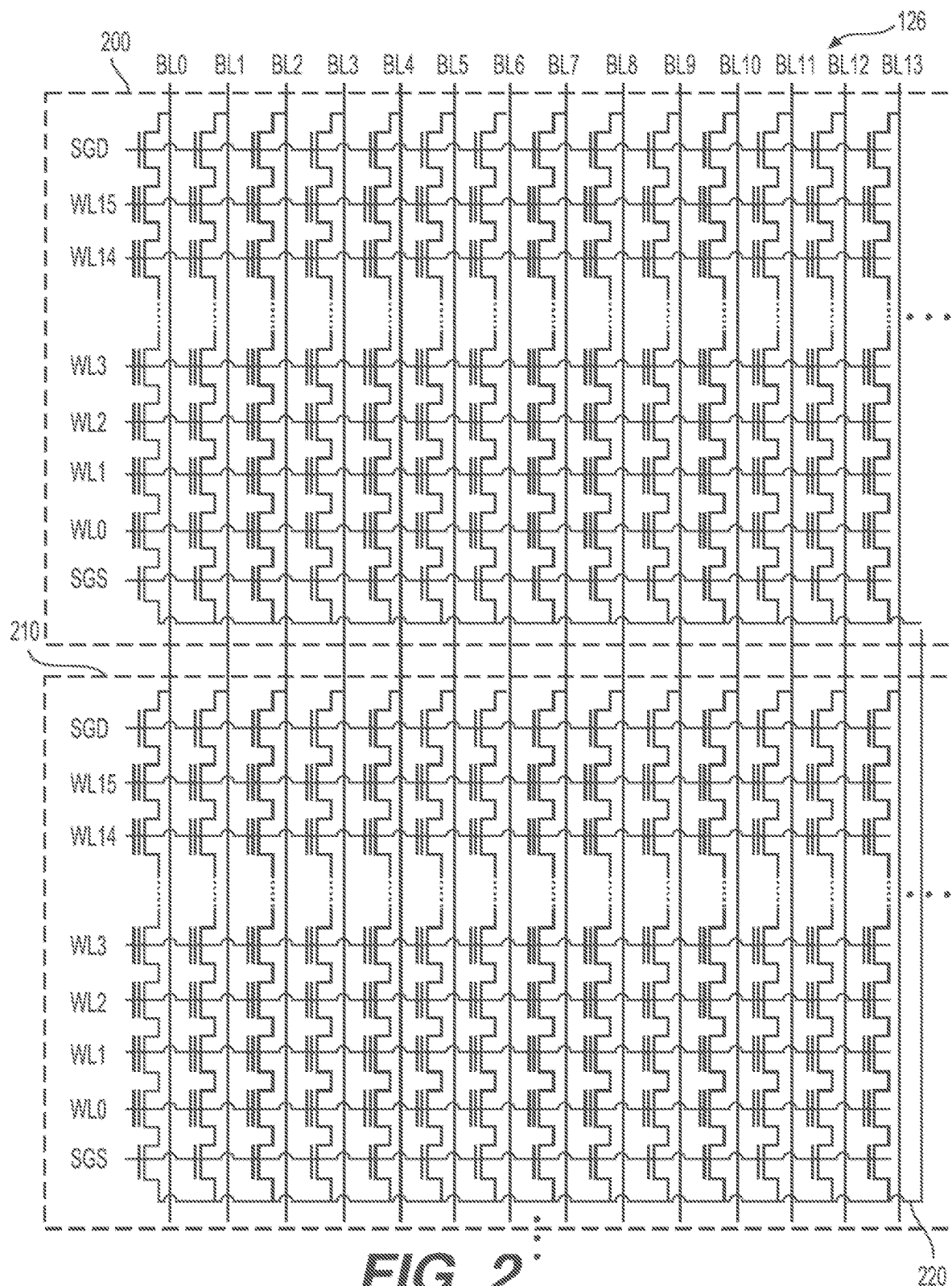
FIG. 2 depicts blocks of memory cells in an example two-dimensional configuration of the memory array of FIG. 1A.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, ... which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
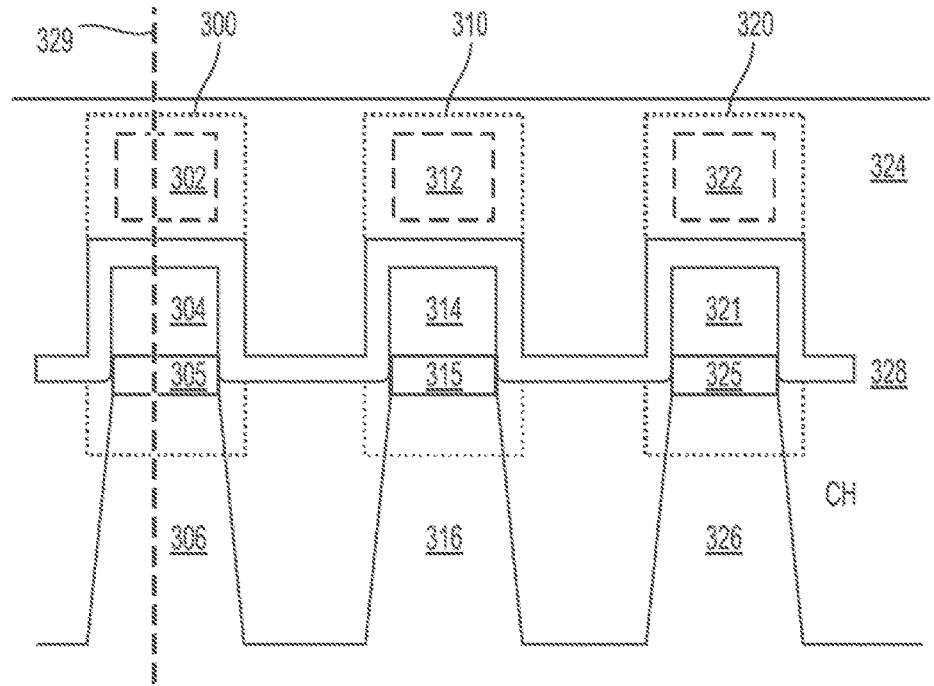
FIG. 3A and FIG. 3B depict cross-sectional views of example floating gate memory cells in NAND strings.
Figure 3B:
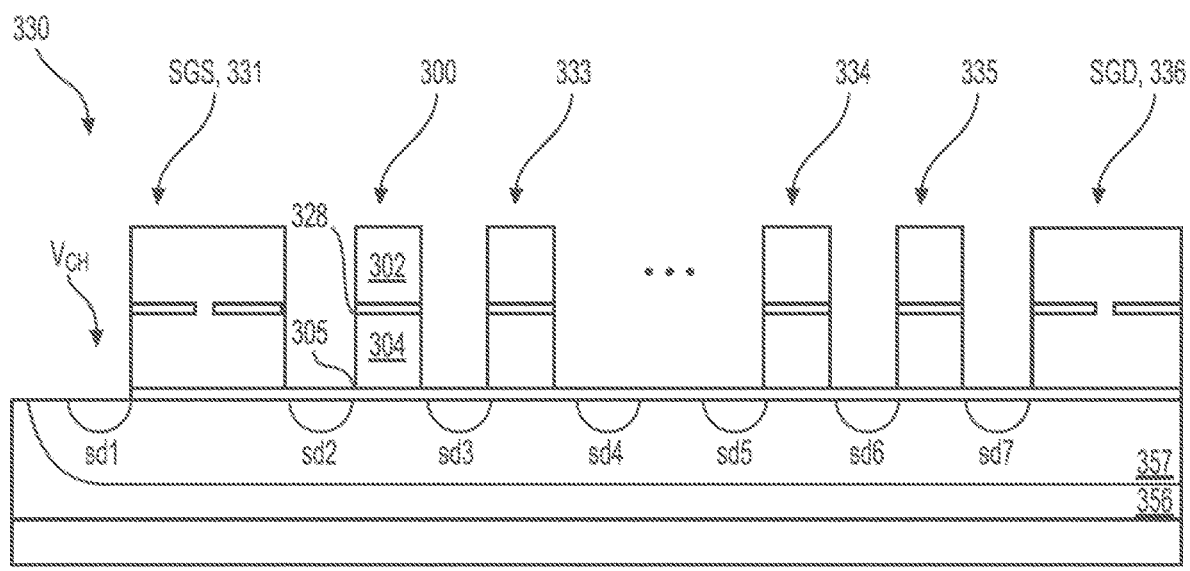

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
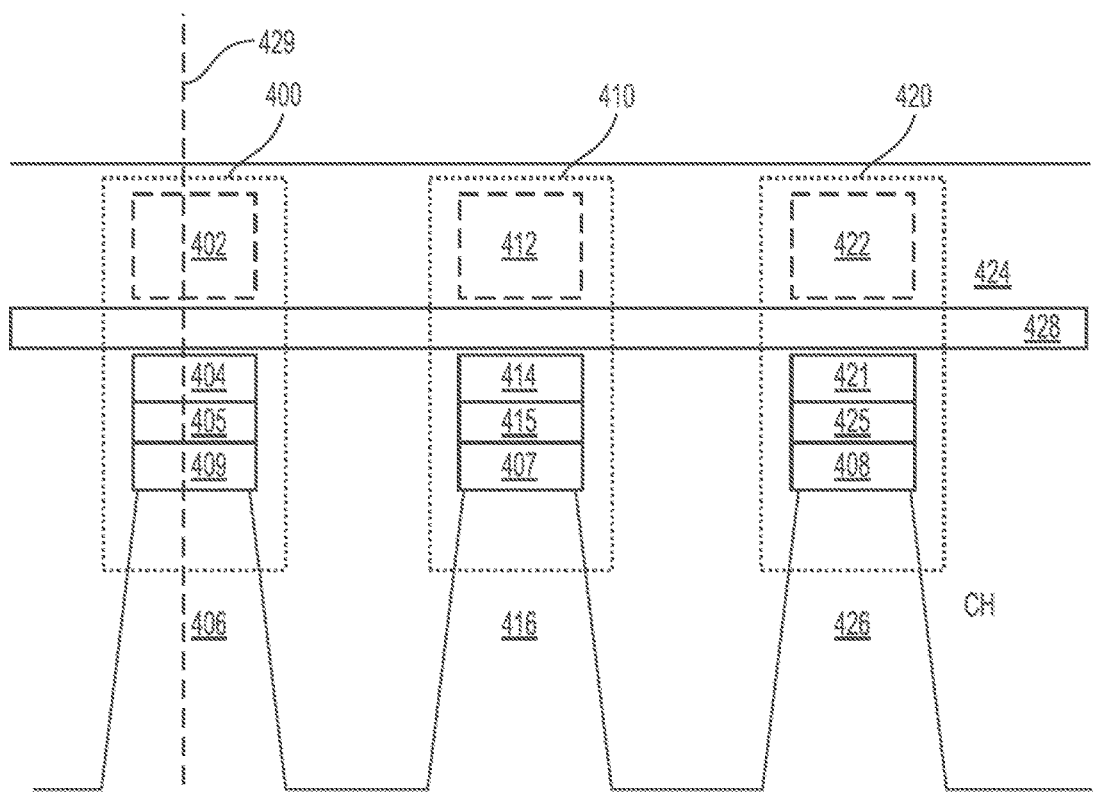
FIG. 4A and FIG. 4B depict cross-sectional views of example charge-trapping memory cells in NAND strings.
Figure 4B:
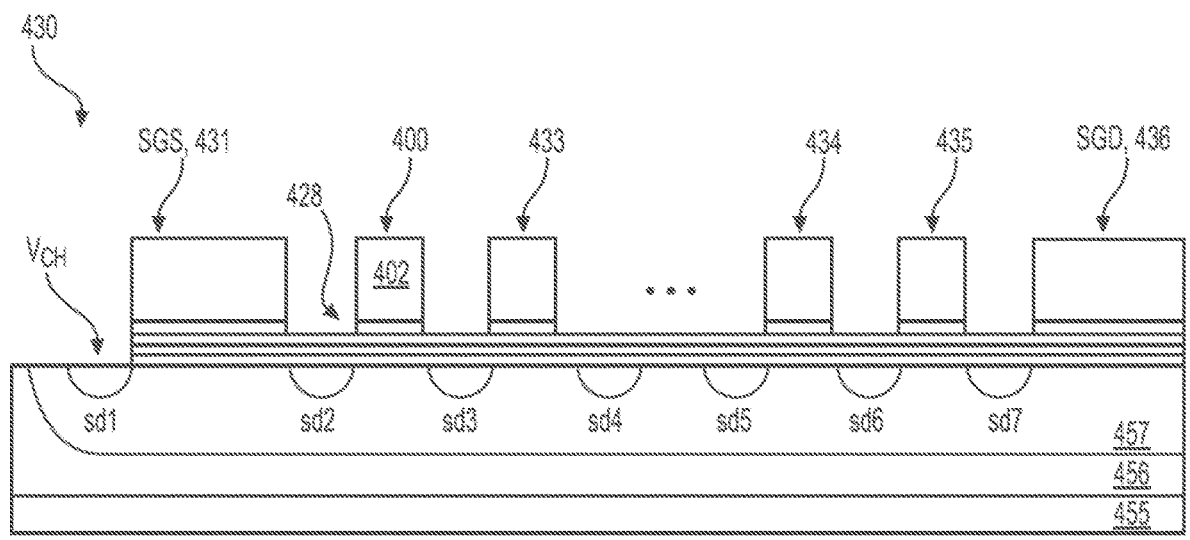

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N-O-N-O-N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
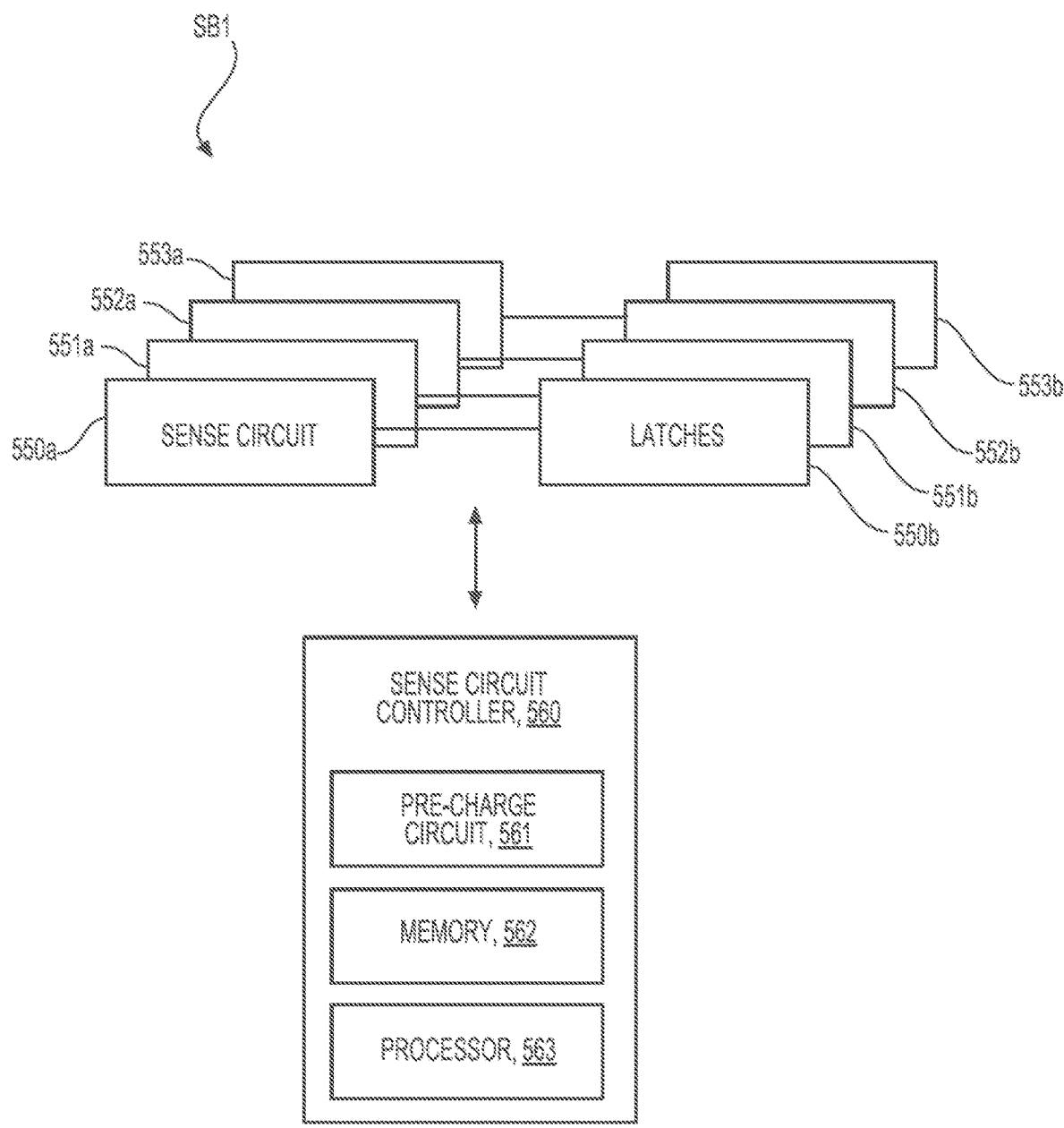
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
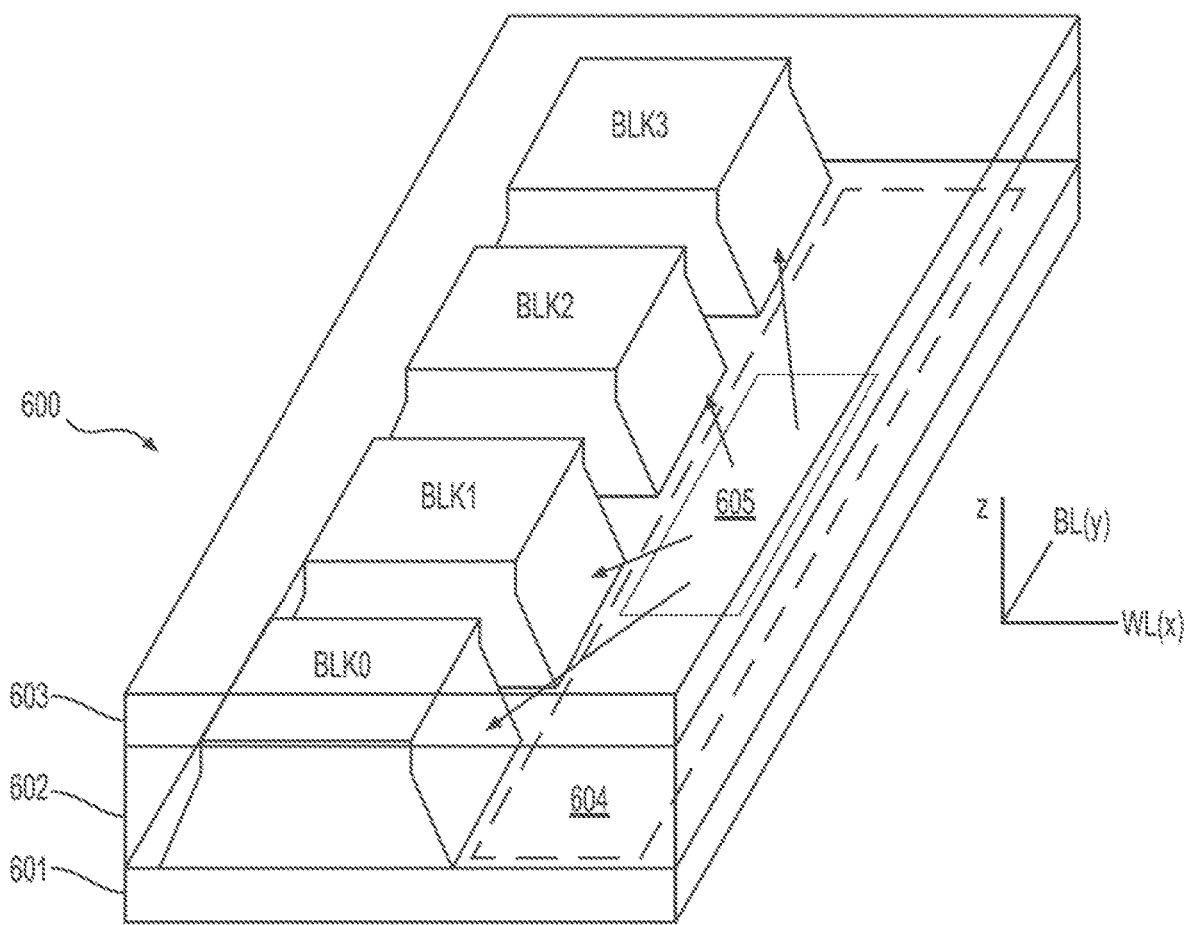
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
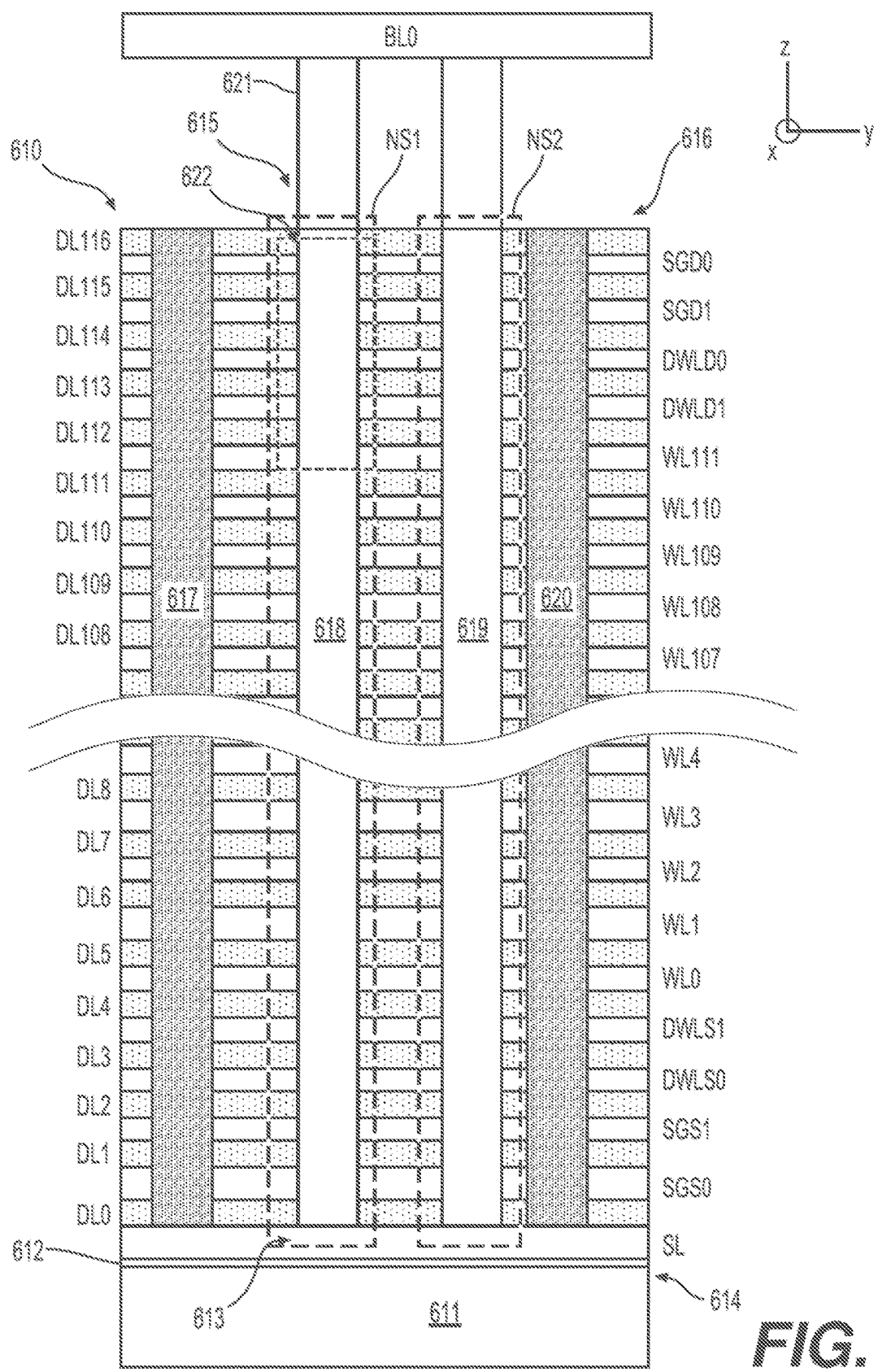
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
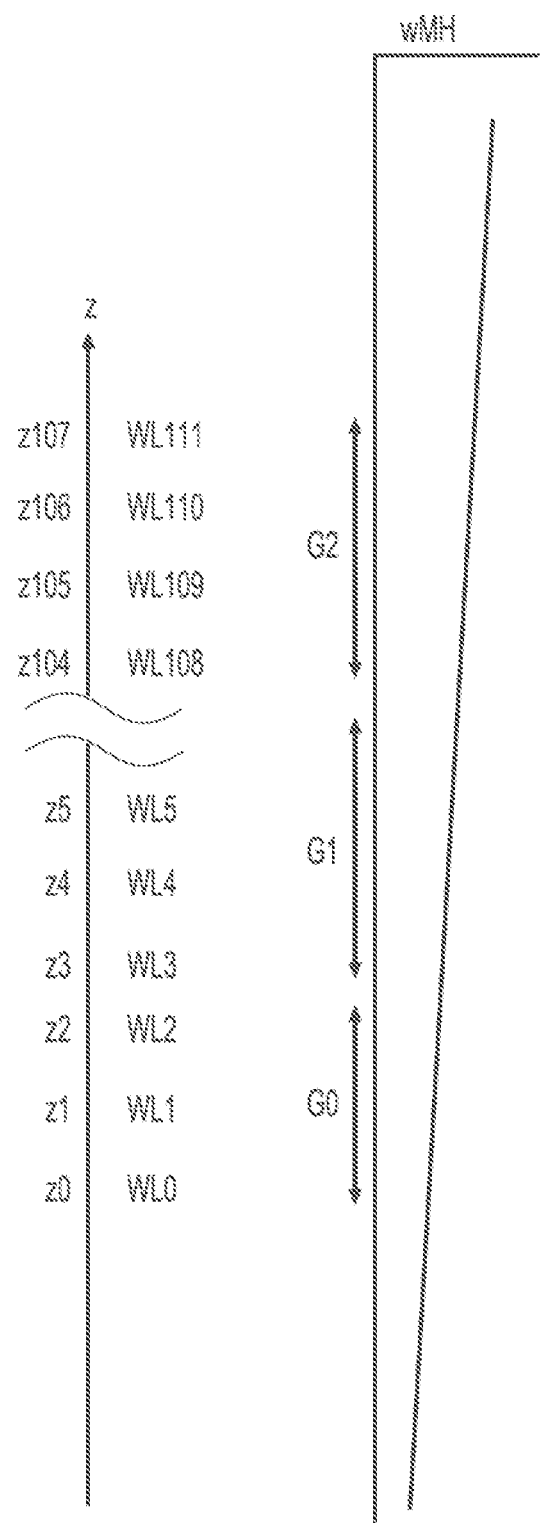
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
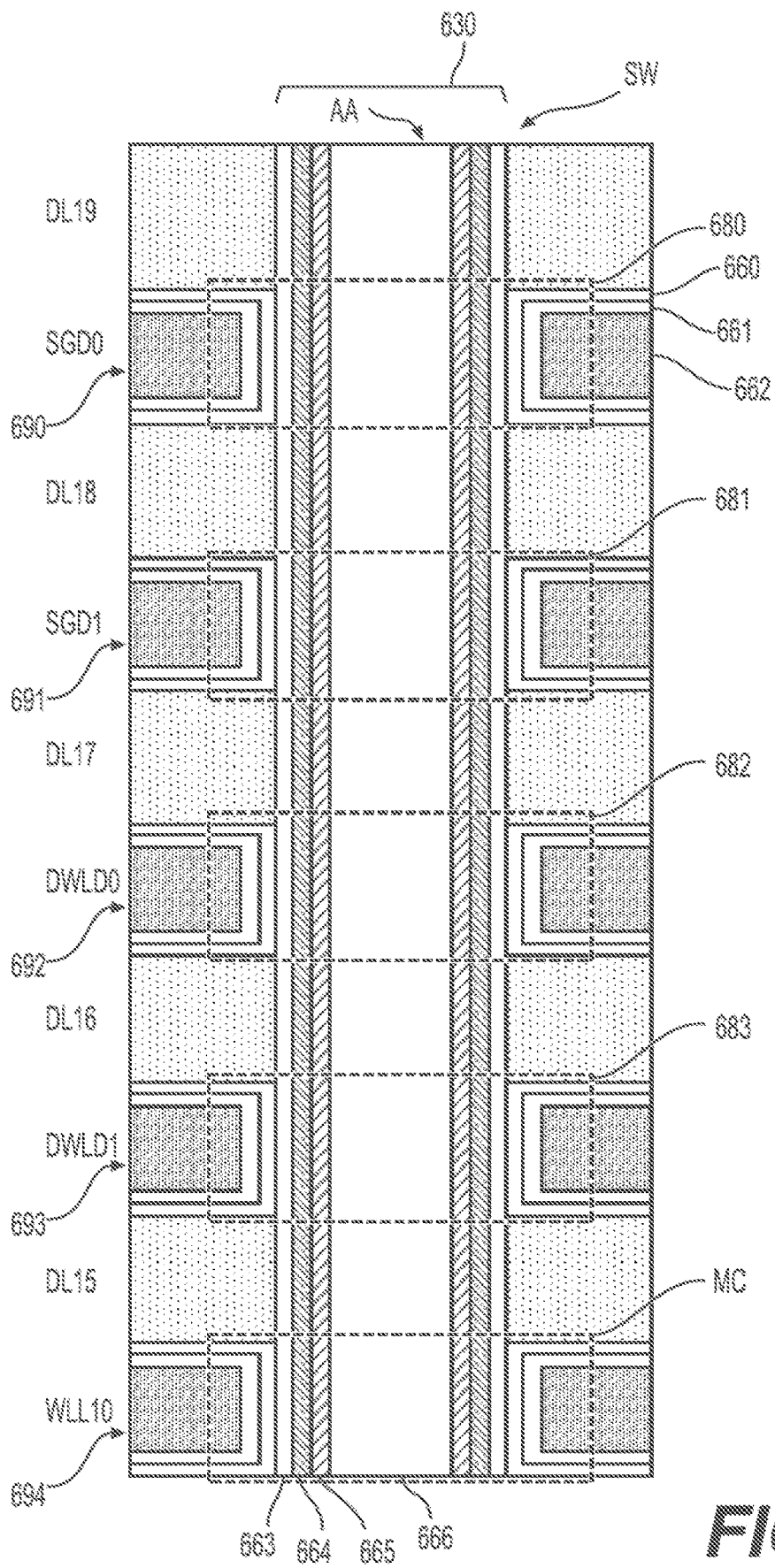
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
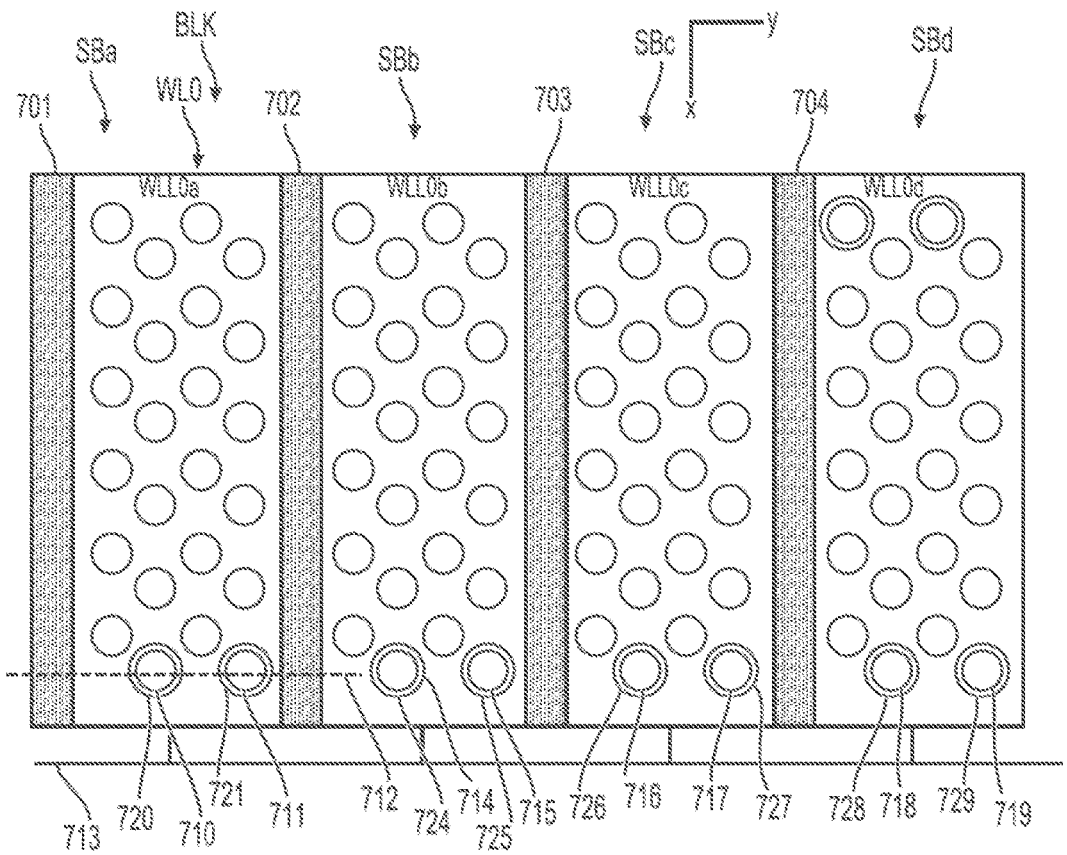
FIG. 7A depicts a top view of an example word line layer WL0 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
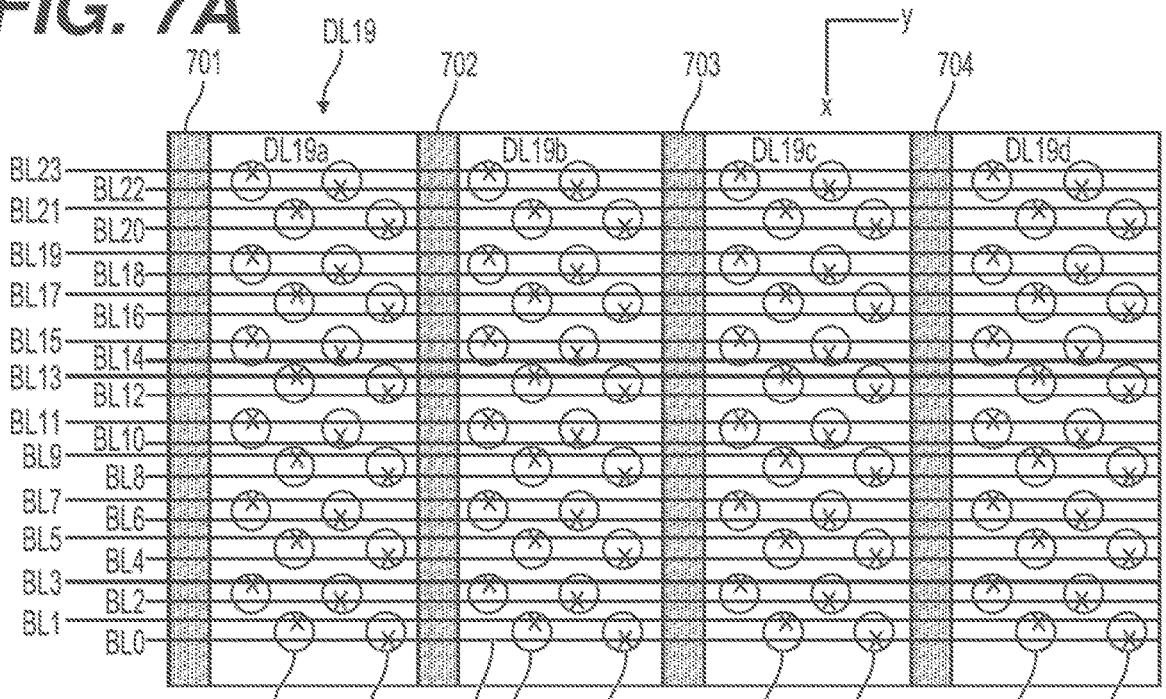
FIG. 7B depicts a top view of an example top dielectric layer DL116 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The memory cells of the memory blocks can be programmed to store one or more bits of data in multiple data states, each of which is associated with a respective threshold voltage Vt. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. FIG. 10 depicts a threshold voltage Vt distribution of a four bits per cell (QLC) storage scheme that includes sixteen total data states, namely the erased state (Er) and fifteen programmed data states (S1-S15). Other storage schemes are also available, such as two bits per cell (MLC) with four data states or five bits per cell (PLC) with thirty-two data states.

Figure 11:
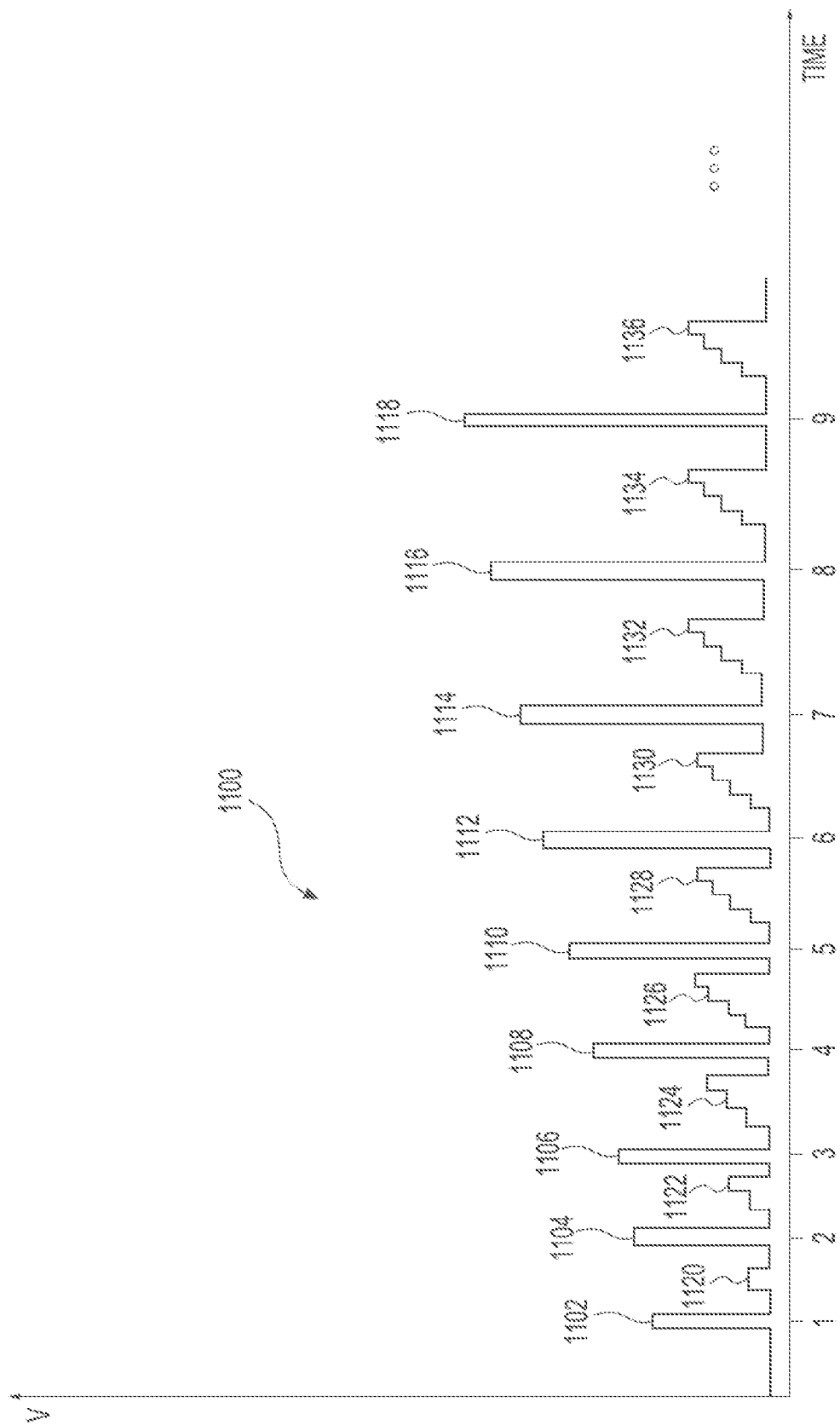
FIG. 11 depicts a voltage waveform of the voltage applied to a control gate of a selected word line during an example programming operation.

Programming to multiple bits per memory cell (for example, MLC, TLC, or QLC) typically includes a plurality of program loops. FIG. 11 depicts a waveform 1100 of the voltages applied to a selected word line during an example memory cell programming operation for programming the memory cells of the selected word line to a greater number of bits per memory cell (e.g., TLC or QLC). As depicted, each program loop includes a programming pulse VPGM and one or more verify pulses, depending on which data states are being programmed in a particular program loop. A square waveform is depicted for each pulse for simplicity; however, other shapes are possible, such as a multilevel shape or a ramped shape.

Incremental Step Pulse Programming (ISPP) is used in this example pulse train, which means that the VPGM pulse amplitude steps up, or increases, in each successive program loop. In other words, the pulse train includes VPGM pulses that increase stepwise in amplitude with each successive program loop by a fixed step size (dVPGM). A new pulse train starts with an initial VPGM pulse level VPGMU and ends at a final VPGM pulse level, which does not exceed a maximum allowed level. The example pulse train 1100 includes a series of VPGM pulses 1101-1115 that are applied to a selected word line that includes a set of non-volatile memory cells. One or more verify voltage pulses 1116-1129 are provided after each VPGM pulse as an example, based on the target data states which are being verified in the program loop. The verify voltages correspond with voltages Vv1-Vv7 shown in FIG. 9 or Vv1-Vv15 shown in FIG. 10. Concurrent with the application of the verify voltages, a sensing operation can determine whether a particular memory cell in the selected word line has a threshold voltage Vt above the verify voltage associated with its intended data state by sensing a current through the memory cell. If the current is relatively high, this indicates that the memory cell is in a conductive state, such that its threshold voltage Vt is less than the verify voltage. If the current is relatively low, this indicates that the memory cell is in a non-conductive state, such that its threshold voltage Vt is above the verify voltage. If the memory cell passes verify, programming of that memory cell is completed and further programming of that memory cell is inhibited for all remaining program loops by applying an inhibit voltage to a bit line coupled with the memory cell concurrent with the VPGM pulse. Programming proceeds until all memory cells pass verify for their intended data states, in which case, programming passes, or until a predetermined maximum number of program loops is exceeded, in which case, programming fails. In some embodiments, the memory cells of a word line can be divided into a series of string groups, or simply strings, that can be programmed independently of one another, and programming can commence from one string to another across the word line before proceeding to the next word line in the memory block.

Figure 12:
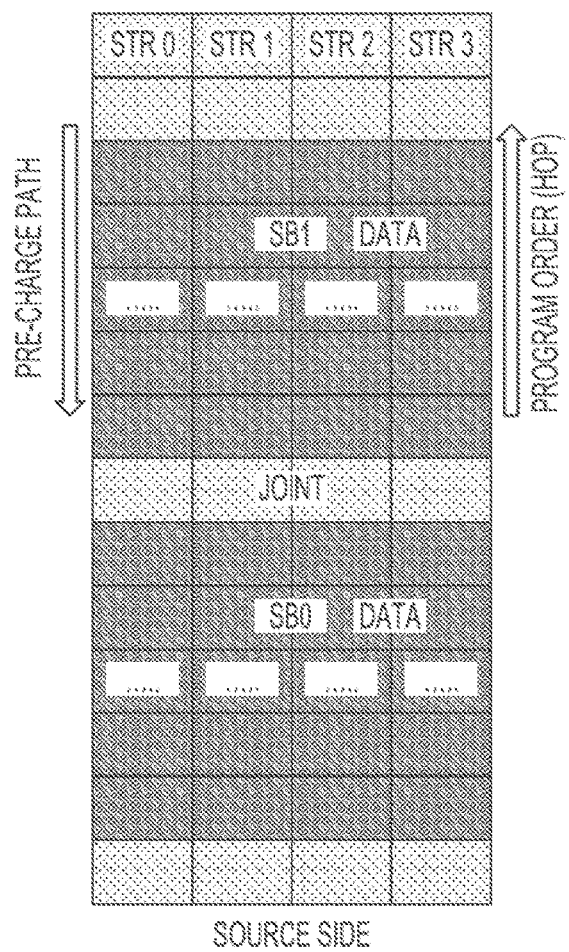
FIG. 12 is a schematic view of an example memory block with two sub-blocks and wherein a lower sub-block is closed and an upper sub-block is being programmed.

In some memory blocks, when data stored therein is no longer needed, before new data can be programmed to the memory cells, all of the memory cells in that memory block must first be erased together. This becomes cumbersome as the number of word lines in a memory block increases with improving technology, and therefore, in some memory devices, the memory blocks are sub-divided into two or more sub-blocks. For example, in the embodiment of FIG. 12 (discussed in further detail below), the memory block has been divided into two sub-blocks, namely a lower (first) sub-block SB0 and an upper (second) sub-block SB1. In the exemplary embodiment, the adjacent sub-blocks SB0, SB1 are separated from one another by a joint, which consists of a plurality of dummy word lines that do not contain data. The lower and upper sub-blocks SB0, SB1 can be programmed and erased independently of one another. In some embodiments, a memory block may be divided into more than two sub-blocks, i.e., three or more sub-blocks. For example, in the embodiment of FIG. 13, the memory block has been divided into three sub-blocks: a lower (first) sub-block SB0, a middle (second) sub-block SB1, and an upper (third) sub-block SB2. The middle sub-block SB1 is located between the lower and upper sub-blocks SB0, SB2. In some embodiments, the memory block can include four or more sub-blocks with multiple middle-blocks.

Within any of the sub-blocks SB0, SB1, SB2, a programming operation starts with all of the memory cells in a selected sub-block being erased. Programming then proceeds in a word line-by-word line basis sequentially from one side of the selected sub-block towards the other. When programming according to a normal order programming scheme, programming starts with the word line of the selected sub-block nearest the drain side of the memory block and proceeds through the selected sub-block towards the source side of the memory block. In a reverse order programming scheme, programming starts with the word line of the selected sub-block nearest the source side of the memory block and proceeds through the selected sub-block towards the drain side of the memory block. In many cases, reverse order programming results in improved margins as compared to normal order programming, i.e., there is a reliability penalty to normal order programming.

Figure 13:
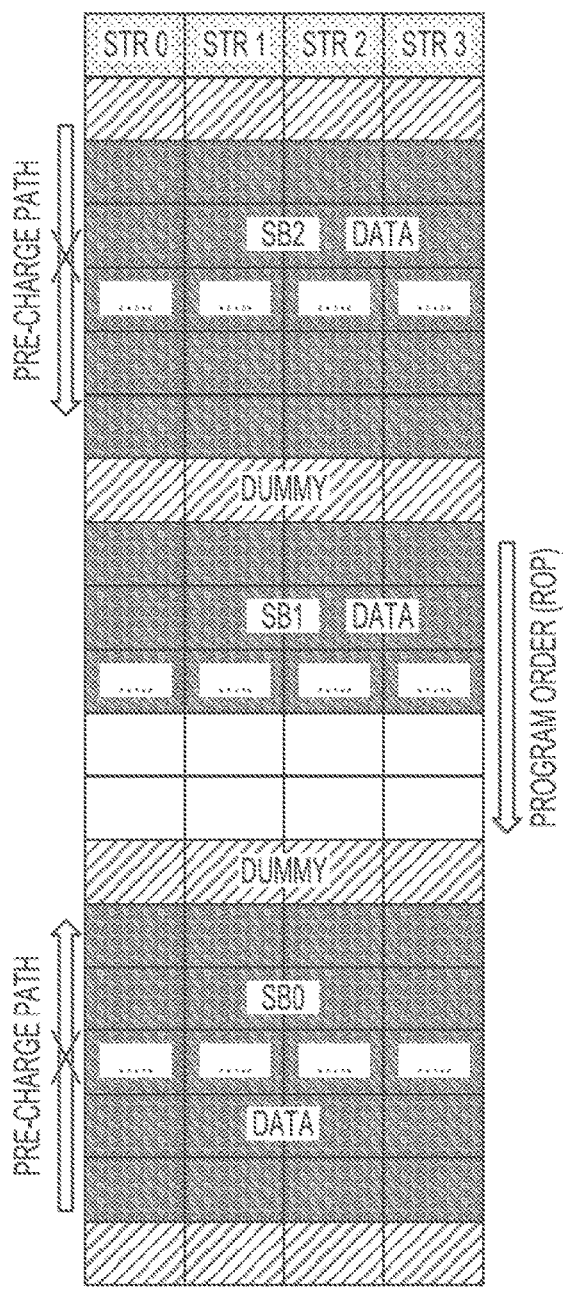
FIG. 13 is a schematic view of an example memory block with three sub-blocks and wherein a lower sub-block and an upper sub-block are closed and a middle sub-block is being programmed.
Figure 14:
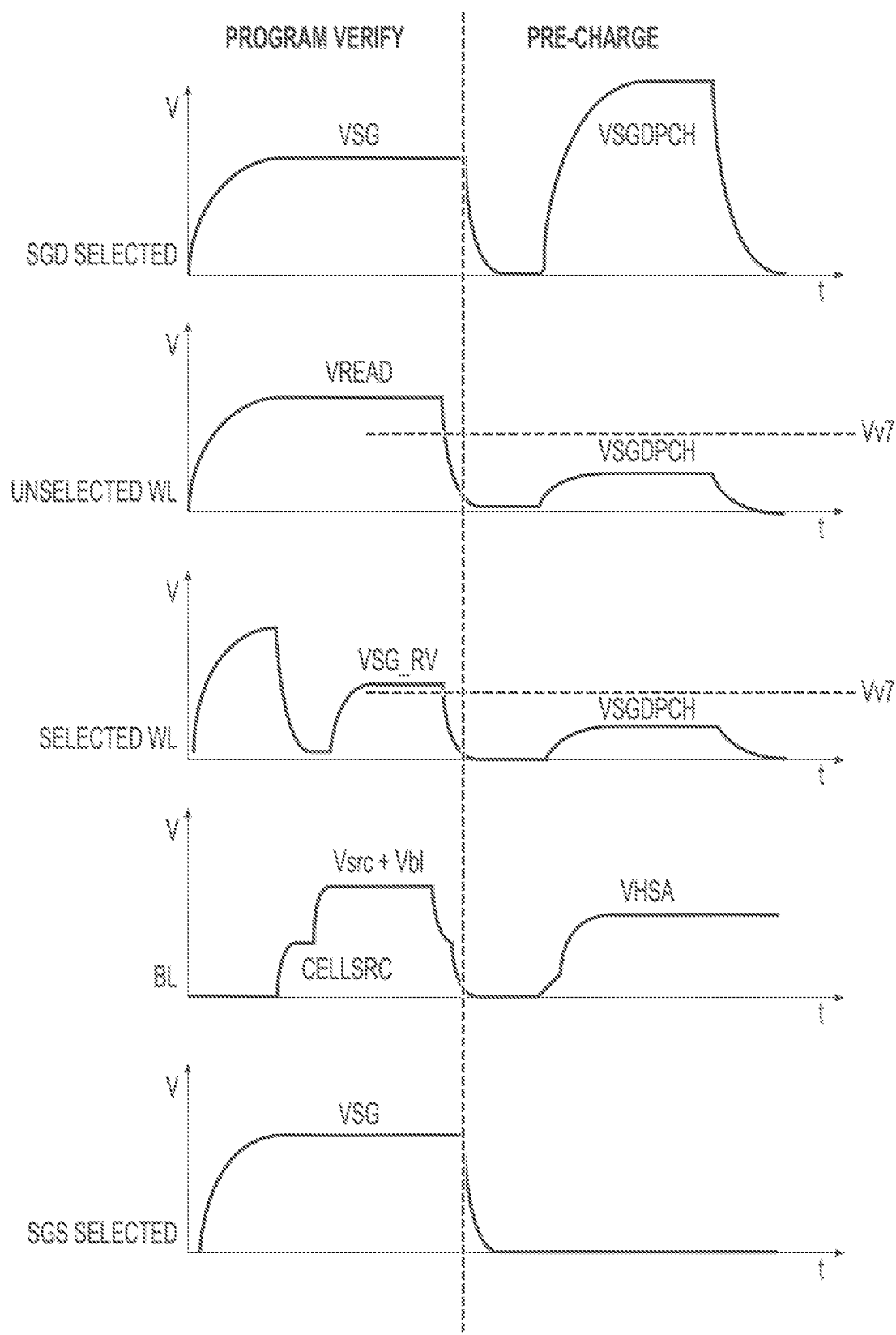
FIG. 14 is a plot of voltages applied to various components of a memory block during an example program verify and pre-charge operation.

Between a program-verify iteration of one program loop and a programming pulse of a next program loop, in order to prevent the occurrence of unintentional programming, or program disturb, the channels containing the memory cells to be programmed may be pre-charged or boosted to scrub any electrons that may remain in those channels following the program-verify iteration. One type of pre-charging operation involves applying a small pre-charge voltage to all of the word lines in a memory block to open the channels and allow electrons in the channel to escape. FIG. 13 depicts the voltages applied to various components of a memory block during a program-verify operation of one program loop and such a pre-charge operation. As illustrated, at the end of the verify operation in this example, the voltages applied to the control gates of all word lines (both the selected word line and the unselected word lines) ramp down simultaneously. Next, during the pre-charge operation, a pre-charge voltage VCHPCH is applied to the control gates of all word lines of the memory block, including both the selected word line and the unselected word lines. Simultaneously, a greater CELSRC voltage (which is approximately two Volts in some embodiments) is applied to the source line to clean the channel and charge the channel to approximately the CELSRC voltage level. Pre-charging the channel mitigates the occurrence of program disturb in memory cells being inhibited during the following programming pulse.

If one of the sub-blocks is fully programmed (closed) when programming another sub-block in the same memory block, then a potential pre-charging issue can arise. For example, in the situation depicted in FIG. 12, the lower sub-block SB0 is closed, and the upper sub-block SB1 is the selected sub-block being programmed. In certain cases, the threshold voltages of the memory cells in the lower sub-block SB0 may be greater than the pre-charge voltage VCHPCH such that these memory cells will not be turned on during the pre-charge operation and electrons remaining in the channel following program-verify cannot pass through the lower sub-block SB0. For example, as illustrated in FIG. 13, in this example, the verify voltage Vv7 is greater than the pre-charge voltage VCHPCH, and thus, any memory cell in the S7 data state will not be turned on by the pre-charge voltage VCHPCH. Such a pre-charge failure could cause, during the next programming pulse, memory cells in inhibited memory holes to be unintentionally programmed in a phenomenon known as program disturb. One effect of such unintentional programming is an undesirably high erased data state upper tail in a resulting threshold voltage Vt distribution of memory cells that were programmed.

One approach to avoid program disturb is to program an empty sub-block from the same side of the memory device as the closed sub-block and pre-charge the memory holes from the side with the empty word lines such that there is a clear pre-charge path to the selected word line that does not include programmed memory cells, which might not be turned on by the pre-charge voltage VCHPCH. For example, in the situation depicted in FIG. 12 where the lower sub-block SB0 is closed and the upper sub-block SB1 is being programmed, by programming the upper sub-block SB1 according to the normal order program scheme (from the source side towards the drain side), and starting the pre-charge path from the drain side of the memory block, the effects of program disturb can be minimized. However, this approach often requires the upper sub-block SB1 to be programmed according to the less-efficient normal order programming direction and also cannot be employed when programming a middle sub-block of a memory block with three or more sub-blocks if the outer sub-blocks have been programmed. For example, in the embodiment of FIG. 13, there is no clear pre-charge path to the middle sub-block SB1 if the lower and upper sub-blocks SB0, SB2 are closed, regardless of whether the programming direction is normal or reverse.

According to an aspect of the present disclosure, an improved programming technique is provided that can be employed in memory blocks that have two or more sub-blocks and allows any of those sub-blocks to be programmed in a reverse order programming direction, regardless of the programming status of the other sub-blocks, with minimal or no resulting program disturb due to inadequate pre-charging. As discussed below, according to these techniques, when programming a selected sub-block that is above (on a drain side of) a closed sub-block, at the end of the program-verify operation of one program loop, the word lines of the memory block are ramped down from their respective voltages in two phases in such a way that the channels adjacent a selected word line being programmed are scrubbed of electrons (pre-charged) during the ramp-down process and no separate pre-charging operation is necessary.

Figure 15:
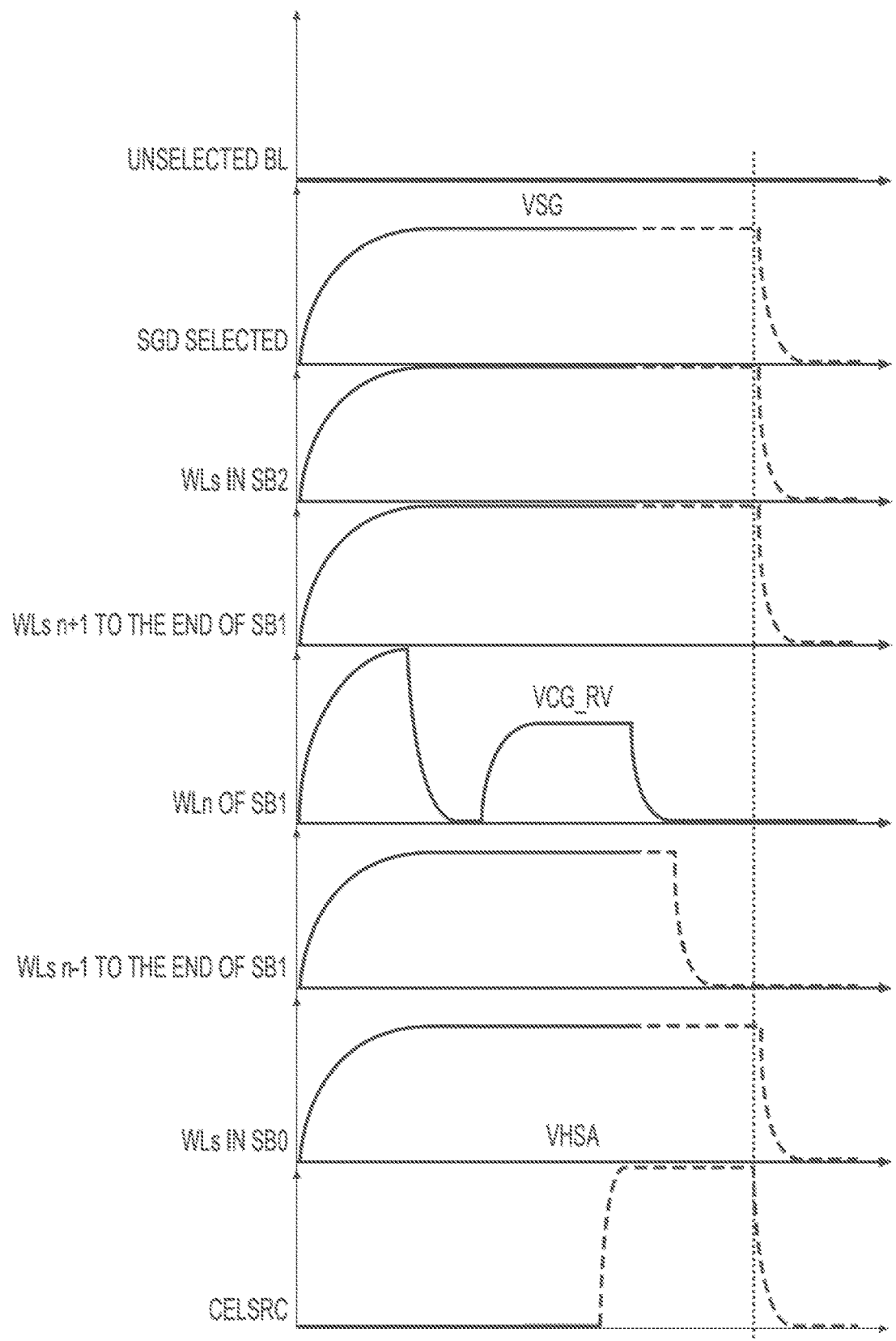
FIG. 15 is a plot of voltages applied to various components of a memory block during a program verify and pre-charge operation according to an aspect of the present disclosure.

Referring now to FIG. 15, depicted are the voltages applied to various components of a memory block during and immediately after a program-verify operation according to one exemplary embodiment of the present disclosure. In this example, the selected word line WLn is located within a middle sub-block of a memory block that includes three or more sub-blocks, e.g., the second sub-block SB1 of the memory block illustrated in FIG. 13. However, in some embodiments, the selected sub-block can be an upper sub-block that is above a closed lower sub-block. Also, in some embodiments, either or both of the lower and upper sub-blocks SB0, SB2 can be open or partially open.

Figure 16:
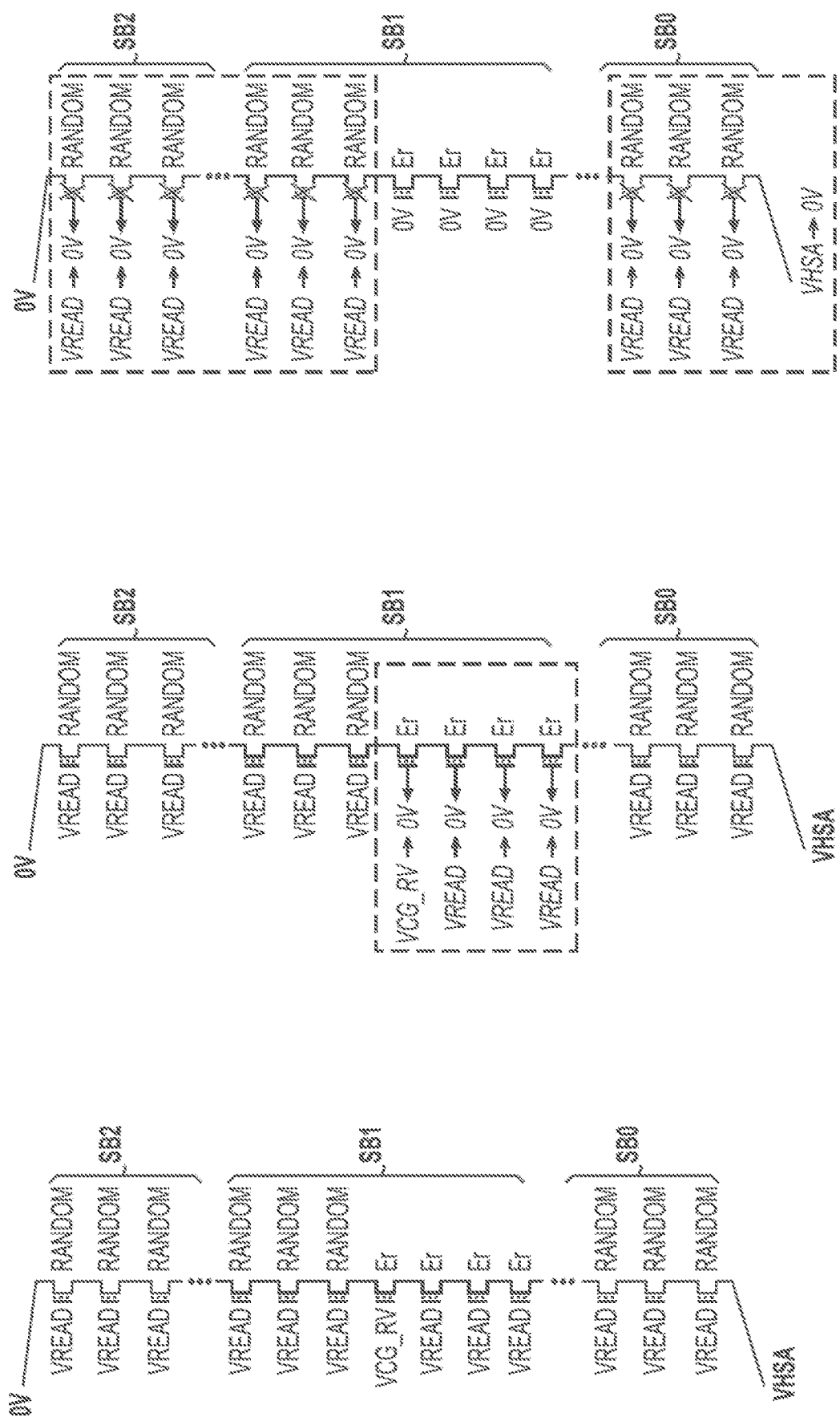
FIG. 16A is a schematic view of a string in a memory block during a program verify operation.
FIG. 16B is a schematic view of the string of the memory block during a first phase of a multi-phase ramp down process.
FIG. 16C is a schematic view of the string of the memory block during a second phase of the multi-phase ramp down process.

As illustrated in FIG. 15, the ramp down process includes two phases: a first phase and a second phase. FIG. 16A schematically depicts the voltages applied to different word lines of the memory block during the program-verify operation, FIG. 16B schematically depicts the voltages during the first phase of ramp-down, and FIG. 16C schematically depicts the voltages applied to the same word lines during the second phase of ramp-down.

As illustrated in FIGS. 15 and 16A, during program-verify, a relatively high pass voltage VREAD is applied to all of the unselected word lines, which includes all word lines in the unselected lower and upper sub-blocks SB0, SB2 and all word lines of the middle sub-block SB1 except the selected word line WLn. A verify voltage VCG_RV is applied to the selected word line WLn at this stage of programming.

Once sensing of the memory cells being programmed in the selected word line WLn is completed, then the first phase of the ramp-down process begins. In the first phase (FIGS. 15 and 16B), all of the word lines of the unselected first and third sub-blocks SB0, SB2 and all of the programmed word lines in the second sub-block SB1 remain at the pass voltage VREAD while only the selected word line WLn and the unprogrammed word lines of the first sub-block SB1 ramp down to a very low voltage, e.g., zero Volts (0 V). In the illustrated example, programming of the word lines occurs in the reverse order programming direction, and thus, the unprogrammed word lines of the selected middle sub-block SB1 are on the source side of the selected word line as the source line. By ramping down only the selected word line WLn and the unprogrammed word lines of the selected sub-block SB1, any electrons in the areas of the channels near the selected word line WLn are migrated out of these areas, thereby increasing the channel potential in these areas.

In the second phase of the ramp-down process, which begins after the first phase is completed, all of the remaining word lines ramp down from the VREAD voltage to the very low voltage, e.g., zero Volts (0 V). Although some electrons may not be scrubbed out of these areas of the channels (the areas of the channels aligned with the unselected sub-blocks and with the already programmed word lines of the selected sub-block), because the channel potential remains high in the area of the selected word lines and the erased word lines, the effects of program disturb are non-existent or minimal. The control circuitry of the memory device may be configured to begin the second phase of the ramp-down process after a predetermined duration following the beginning of the first phase.

Figure 17:
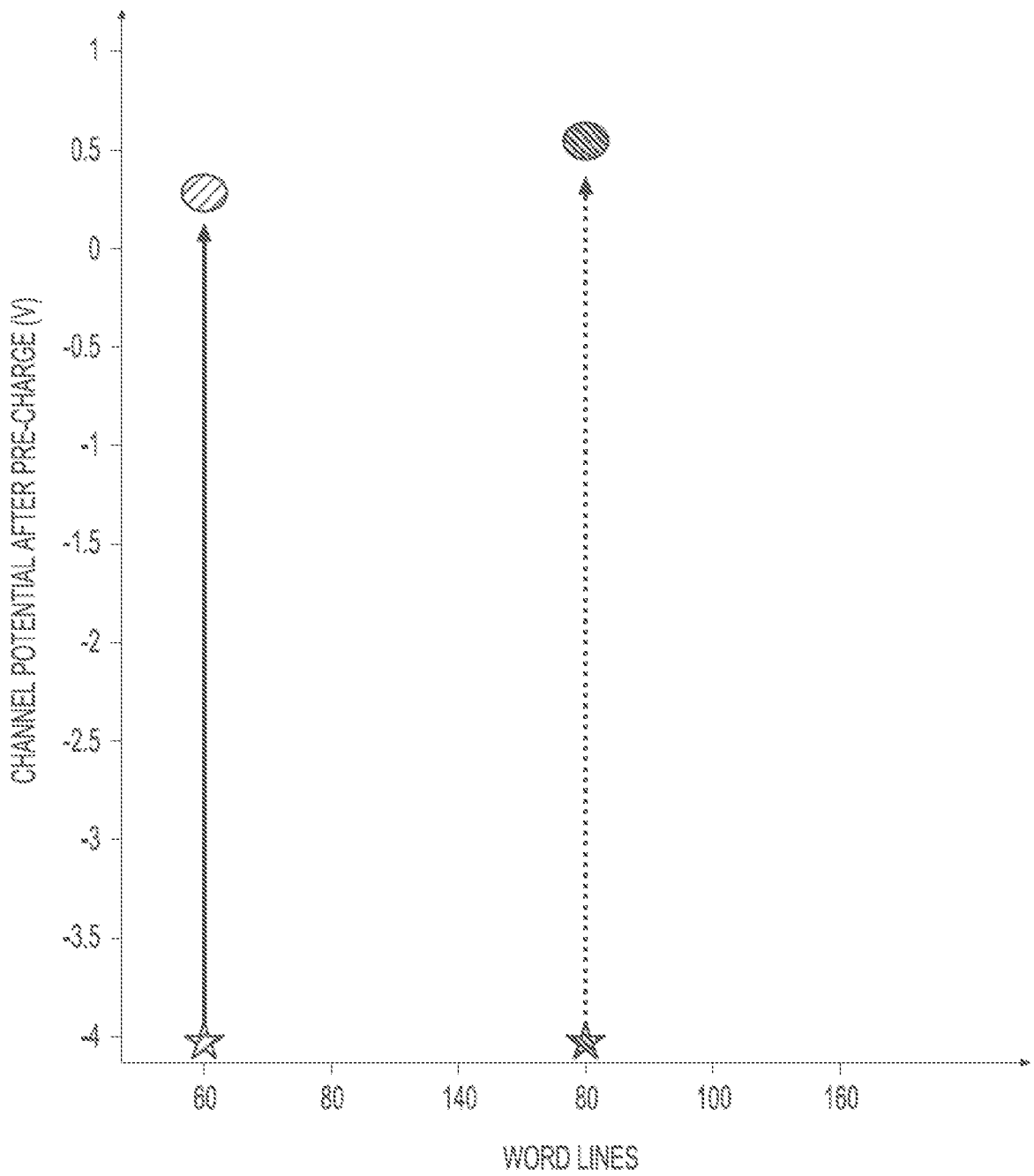
FIG. 17 is a plot of channel pre-charge following pre-charging according to the techniques in the present disclosure at different locations within a sub-block being programmed.

FIG. 17 is a plot of channel potential in different locations within a middle sub-block of a memory block that includes three or more sub-blocks, e.g., the second sub-block SB1 of the embodiment of FIG. 13. More specifically, in FIG. 17, the channel potential at two different word lines (WL60 and WL80) is measured in two different testing scenarios. The data points 1700a, 1700b illustrate the channel potential during programming according to a conventional programming technique with a conventional pre-charge operation between the program-verify operation of one program loop and the programming pulse of a next program loop. In contrast, data points 1702a, 1702b illustrate the channel potential during programming according to the techniques of the present disclosure. As illustrated, at both measured word lines WL60 and WL80, the channel potential is significantly higher following the two-phase ramp down process of the present disclosure than it is according to the conventional technique. This increased channel potential protects the memory cells of the second sub-block SB1 from program disturb by reducing the voltage difference between the channel and an unselected word line during the programming pulse to follow. In other words, program disturb is less when programming according to the techniques of the present disclosure than according to the conventional technique.

In the example of FIG. 17, word line WL80 is adjacent the drain side of the second sub-block SB1, and thus word line WL80 is the first or one of the first word lines of sub-block SB1 to be programmed according to a reverse order programming scheme. Word line WL60, on the other hand, is in the middle of the second sub-block SB1. As illustrated, in this example, the channel potential is only slightly lower following the two-phase ramp down process when programming word line WL60 than when programming WL80. Accordingly, the two-phase ramp down process is effective at preventing program disturb at different locations within the middle sub-block SB1.

In some embodiments, the two-phase ramp down process to pre-charge the channels is only applied to most, but not all, of the word lines of a selected sub-block. Rather, when there are zero or very few (i.e., less than a predetermined threshold number of) unprogrammed word lines left in the selected sub-block, it may be beneficial to switch from the two-phase ramp down process to pre-charge the channels to a more conventional type of pre-charge process. The length of time that the pre-charge process takes place for such word lines can be increased to improve the effectiveness of the pre-charge operation prior to programming, albeit this improvement may come at the cost of programming performance.

By ramping down the selected word line and the unprogrammed (erased) word lines first, the channel potential is improved substantially such that a separate pre-charge operation is not required. In other words, according to these programming techniques, pre-charging of the memory holes occurs during the ramp-down phase, and the additional time required to pre-charge the channels prior to the programming pulse is minimal.

Figure 18:
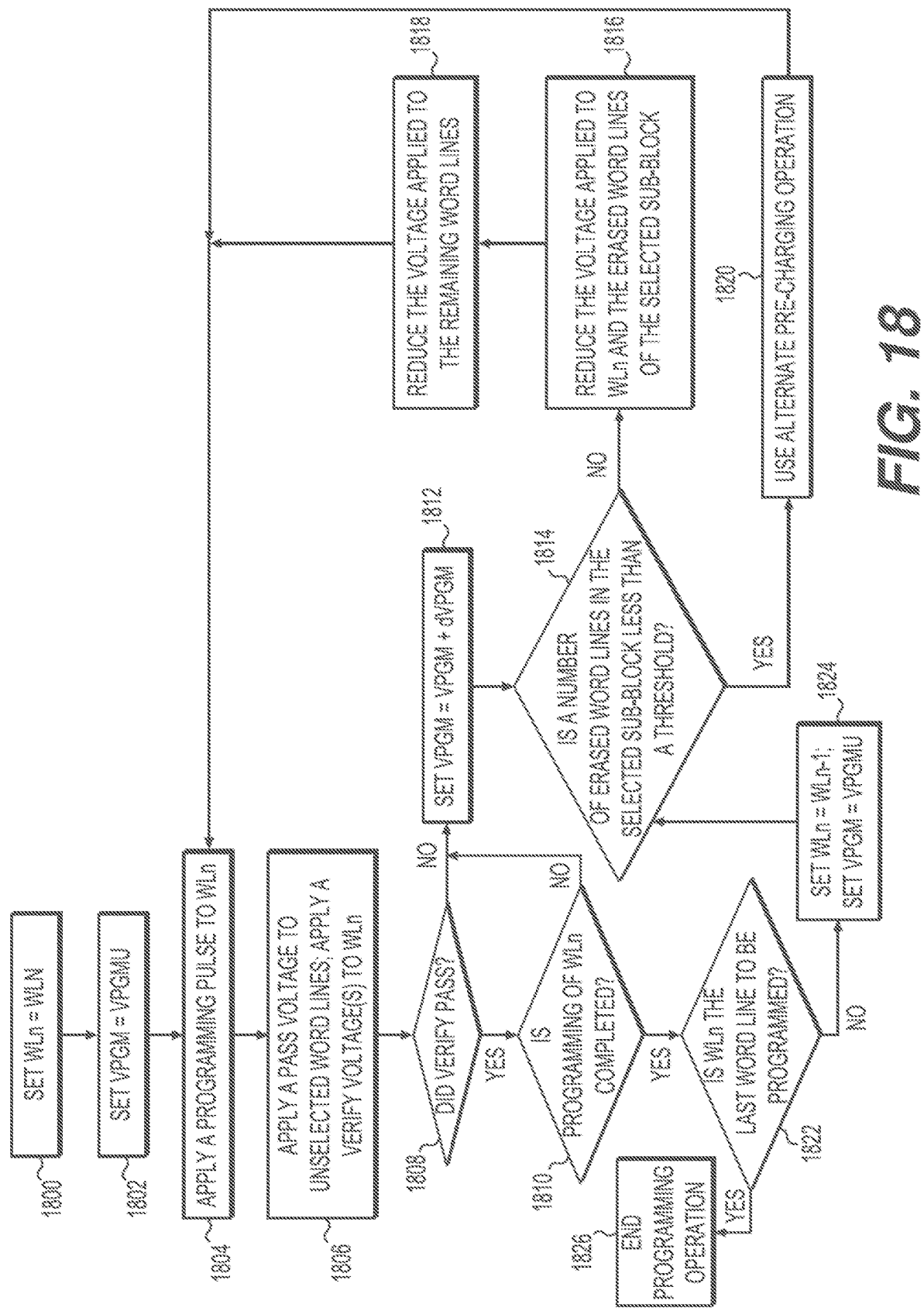
FIG. 18 is a flow chart depicting the steps of programming a selected sub-block according to an aspect of the present disclosure.

Turning now to FIG. 18, a flow chart is provided depicting the steps of programming the memory cells of a selected sub-block of a memory device according to an exemplary embodiment of the present disclosure. In at least some preferred embodiments, the selected sub-block is above (on a drain side of) a closed or partially closed sub-block. For example, the selected sub-block could be a middle sub-block above a lower sub-block that is closed in a memory block with three or more sub-blocks or the selected sub-block could be an upper sub-block above a lower sub-block that is closed in a memory block that includes only two sub-blocks.

At step 1800, a programming command is received, and the selected word line WLn is set to a first word line to be programmed WLN. Preferably, the programming direction is reverse, and thus, the WLN is the nearest word line in the selected sub-block to the drain side of the memory block, e.g., WL80. However, in some embodiments, the programming direction could be normal such that WLN is the nearest word line in the selected sub-block to the source side of the memory block. At step 1802, the programming voltage VPGM is set to an initial programming voltage VPGMU.

At step 1804, a program loop begins with the application of a programming pulse to the selected word line WLn. Upon completion of the programming pulse, at step 1806, the program-verify operation starts. Specifically, at step 1806, a pass voltage is applied to the unselected word lines and a one or more verify voltage is applied to the selected word line WLn.

At decision step 1808, it is determined if the verify operation passed. If the answer at decision step 1808 is "yes," then at decision step 1810, it is determined if programming of the selected word line WLn is completed, i.e., has verify been completed for all data states?

If the answer at either decision step 1080 or decision step 1810 is "no," then at step 1812, the programming voltage VPGM is incrementally advanced, i.e., VPGM=VPGM+dVPGM.

At decision step 1814 it is determined if a number of erased word lines remaining in the selected sub-block is less than a threshold. The threshold can be determined experimentally and is set at a number of word lines where the two-phase ramp down operation no longer is advantageous as compared to other pre-charging options.

If the answer at decision step 1814 is "no," then at step 1816, the voltages applied to the selected word line WLn and the erased word lines of the selected sub-block during verify are reduced, or ramped down to a very low voltage, e.g., zero Volts (0V) to pre-charge the portions of the channels in the areas of the selected word line. At step 1818, the voltages applied to the remaining word lines in the memory block during verify are reduced, or ramped down. If the answer at decision step 1814 is "yes," then at step 1820, an alternate pre-charging operation is performed.

Following either step 1818 or 1820, the process returns to step 1804 to begin a next program loop.

If the answer at aforementioned decision step 1810 is "yes," then at decision step 1822, it is determined if the selected word line WLn is the last word line to be programmed. If the answer at decision step 1822 is "no," then at step 1824, the selected word line is incrementally advanced and the programming voltage VPGM is reset to the initial programming voltage VPGMU. If the programming direction is the preferred reverse order programming direction then WLn is set to WLn−1. If the programming direction is normal order programming direction, then WLn is set to WLn+1. Following step 1824, the process proceeds to aforementioned step 1814.

If the answer at decision step 1822 is "yes," then at step 1826, the programming operation is ended. The answer to decision step 1822 could be "yes" either if all data to be programmed to the sub-block has completed programming or if the selected word line WLn is the last word line in the sub-block.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:
preparing a memory block that includes a plurality of memory cells arranged in a plurality of word lines that are divided into a plurality of sub-blocks which can be erased and programmed independently of one another;
programming each of the word lines of a selected sub-block of the plurality of sub-blocks in a plurality of program loops, at least one program loop of the plurality of program loops including;
applying a programming pulse to a selected word line, simultaneously applying a verify voltage to the selected word line and applying a pass voltage to a plurality of unselected word lines,
in a first phase of a multi-phase pre-charge process, reducing the voltages applied to at least some of the word lines in the selected memory block to pre-charge portions of a plurality of channels in the memory block, and
in a second phase that follows the first phase, reducing the voltages applied to other word lines in the selected memory block.

2. The method as set forth in claim 1, wherein in the first phase of the multi-phase pre-charge process, the voltages applied to the selected word line and at least one unprogrammed word line in the selected sub-block to a low voltage are reduced, and
in the second phase the voltages applied to all word lines that remained at the pass voltage are reduced to the low voltage.

3. The method as set forth in claim 1, wherein the programming of the word lines of the selected sub-block is according to a reverse order programming scheme.

4. The method as set forth in claim 1, wherein the memory block includes three or more sub-blocks including a lower sub-block on a source side of the memory block and an upper sub-block on a drain side of the memory block and at least one middle sub-block that is located between the lower and upper sub-blocks.

5. The method as set forth in claim 4, wherein the lower sub-block is closed.

6. The method as set forth in claim 5, wherein the upper sub-block is closed, and wherein the selected sub-block is the at least one middle sub-block.

7. The method as set forth in claim 1, wherein the memory block includes exactly two sub-blocks including a lower sub-block on a source side of the memory block and an upper sub-block on a drain side of the memory block, wherein the lower sub-block is closed, and wherein the selected sub-block is the upper sub-block.

8. The method as set forth in claim 1, wherein at least one of the program loops includes the step of comparing a number of unprogrammed word lines in the selected sub-block to a threshold, and if the number of unprogrammed word lines in the selected sub-block is less than the threshold, then the multi-phase pre-charge process is skipped and an alternative pre-charge process pre-charges a plurality of channels in the memory block.

9. A memory device, comprising:
a memory block that includes a plurality of memory cells arranged in a plurality of word lines that are divided into a plurality of sub-blocks which can be erased and programmed independently of one another;
control circuitry configured to program each of the word lines of a selected sub-blocks of the plurality of sub-blocks in a plurality of program loops, during at least one program loop of the plurality of program loops, the control circuitry being configured to:
apply a programming pulse to a selected word line,
simultaneously apply a verify voltage to the selected word line and apply a pass voltage to a plurality of unselected word lines,
in a first phase of a multi-phase pre-charge process, reduce the voltages applied to the selected word line and at least one unprogrammed word line in the selected sub-block to a low voltage, and
in a second phase that follows the first phase of the multi-phase pre-charge process, reduce the voltages applied to all word lines that remained at the pass voltage to the low voltage.

10. The memory device as set forth in claim 9, wherein the control circuitry is configured to program the word lines of the selected sub-block according to a reverse order programming scheme.

11. The memory device as set forth in claim 9, wherein the memory block includes three or more sub-blocks including a lower sub-block on a source side of the memory block and an upper sub-block on a drain side of the memory block and at least one middle sub-block that is located between the lower and upper sub-blocks.

12. The memory device as set forth in claim 11, wherein the lower sub-block is closed.

13. The memory device as set forth in claim 12, wherein the upper sub-block is closed, and wherein the selected sub-block is the at least one middle sub-block.

14. The memory device as set forth in claim 9, wherein the memory block includes exactly two sub-blocks including a lower sub-block on a source side of the memory block and an upper sub-block on a drain side of the memory block, wherein the lower sub-block is closed, and wherein the selected sub-block is the upper sub-block.

15. The memory device as set forth in claim 9, wherein in at least one of the program loops, the control circuitry is configured to compare a number of unprogrammed word lines in the selected sub-block to a threshold, and if the number of unprogrammed word lines in the selected sub-block is less than the threshold, then the control circuitry is configured to skip the multi-phase pre-charge process and apply an alternative pre-charge process to pre-charge a plurality of channels in the memory block.

16. An apparatus, comprising:
a memory block that includes a plurality of memory cells arranged in a plurality of word lines that are divided into at least three sub-blocks which can be erased and programmed independently of one another, the at least three sub-blocks including an upper sub-block on one side of the memory block, a lower sub-block on an opposite side of the memory block, and a middle sub-block between the upper and lower sub-blocks;
a programming means for programming the memory cells of each of the word lines of a selected sub-blocks of the plurality of sub-blocks in a plurality of program loops;
when the selected sub-block is the middle sub-block according to a reverse order programming scheme, during at least one program loop the programming means being configured to:
simultaneously apply a verify voltage to a selected word line in the middle sub-block and apply a pass voltage to a plurality of unselected word lines,
in a first phase of a multi-phase pre-charge process, reduce the voltages applied to the selected word line and at least one unprogrammed word line in the middle sub-block to a low voltage, and
in a second phase that follows the first phase, reduce the voltages applied to all word lines that remained at the pass voltage to the low voltage.

17. The apparatus as set forth in claim 16, wherein the programming means is configured to program the word lines of all of the sub-blocks according to the reverse order programming scheme.

18. The apparatus as set forth in claim 16, wherein the lower sub-block is closed.

19. The apparatus as set forth in claim 16, wherein the upper sub-block is closed.

20. The apparatus as set forth in claim 16, wherein in at least one of the program loops, the programming means is configured to compare a number of unprogrammed word lines in the middle sub-block to a threshold, and if the number of unprogrammed word lines in the selected sub-block is less than the threshold, then the programming means is configured to skip the multi-phase pre-charge process and apply an alternative pre-charge process to pre-charge a plurality of channels in the memory block.

* * * * *